(12) United States Patent
Dieppedale et al.

(10) Patent No.: US 8,685,777 B2
(45) Date of Patent: Apr. 1, 2014

(54) METHOD FOR FABRICATING A FIXED STRUCTURE DEFINING A VOLUME RECEIVING A MOVABLE ELEMENT IN PARTICULAR OF A MEMS

(75) Inventors: Christel Dieppedale, Crolles (FR); Stephan Borel, Crolles (FR); Bruno Reig, Moirans (FR); Henri Sibuet, La Buisse (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 413 days.

(21) Appl. No.: 13/176,371

(22) Filed: Jul. 5, 2011

(65) Prior Publication Data
US 2012/0021550 A1 Jan. 26, 2012

(30) Foreign Application Priority Data

Jul. 5, 2010 (FR) ...................... 10 55434

(51) Int. Cl.
*H01L 21/02* (2006.01)
*B81C 1/00* (2006.01)
*H01H 1/00* (2006.01)

(52) U.S. Cl.
CPC ......... *B81C 1/00158* (2013.01); *B81C 1/00492* (2013.01); *B81B 2201/018* (2013.01); *B81B 2201/0264* (2013.01); *B81B 2203/0118* (2013.01); *B81B 2003/0361* (2013.01); *B81C 2201/0178* (2013.01); *H01H 1/0036* (2013.01)
USPC ..................................... 438/50; 257/E21.002

(58) Field of Classification Search
None
See application file for complete search history.

(56) References Cited

U.S. PATENT DOCUMENTS

| 5,919,548 A | 7/1999 | Barron et al. |
| 2006/0003511 A1 | 1/2006 | Hebert et al. |
| 2008/0308884 A1 | 12/2008 | Kalvesten |
| 2009/0142872 A1 | 6/2009 | Park et al. |
| 2010/0059816 A1* | 3/2010 | Shimada et al. ............. 257/334 |

FOREIGN PATENT DOCUMENTS

| EP | 1900679 A1 | 3/2008 |
| WO | WO 2004/016036 A2 | 2/2004 |

OTHER PUBLICATIONS

Souchon, F. et al., "Dielectric Charging Sensitivity on Mems Switches," IEEE, Piscataway, NJ, Jun. 10, 2007, pp. 363-366.
French Preliminary Search Report, dated Apr. 28, 2011 regarding French Patent Application No. FR 1055434—(7 pgs).

* cited by examiner

*Primary Examiner* — Seahvosh Nikmanesh
(74) *Attorney, Agent, or Firm* — Brinks Gilson & Lione

(57) ABSTRACT

The fabrication of a semiconductor fixed structure defining a volume, for example of a MEMS micro electro-mechanical system includes, determining thicknesses beforehand depending on the functional distances associated with elements. At least one element is formed on a substrate by thermal oxidation of the substrate so as to form an oxide layer followed by selective etching of the oxide layer so as to define the volume in an etched portion by baring the underlying substrate so as to define the element in an unetched portion, and later oxidation of the substrate so as to form an oxide layer, in order to obtain the elements at the functional distances.

11 Claims, 4 Drawing Sheets

METHOD FOR FABRICATING A FIXED STRUCTURE DEFINING A VOLUME RECEIVING A MOVABLE ELEMENT IN PARTICULAR OF A MEMS

This application claims the priority of French patent application No. 10 55434, filed Jul. 5, 2010, which is incorporated by reference herein.

TECHNICAL FIELD

The present invention concerns a method of fabricating a fixed semiconductor structure defining a volume, for example entering into the design of a Micro Electro-Mechanical System referred to hereinafter as a MEMS, including NEMS ("Nano Electro-Mechanical Systems") in particular.

BACKGROUND

The volume defined by this fixed structure is in particular configured to enable the movement of a movable (or mechanically deformable) element of the MEMS component, the movable element generally being attached to or "suspended" from the fixed structure.

The invention applies particularly well to the fabrication of MEMS with a deformable membrane, such as capacitive detection pressure sensors or switches, for example ohmic electrostatic switches as described in the article titled "DIELECTRIC CHARGING SENSITIVITY ON MEMS SWITCHES", F. Souchon, P L. Charvet, C. Maeder-Pachurka, M. Audoin (2007).

Like integrated circuits in microelectronics, MEMS components are fabricated on the same silicon wafer by stacking of different thin layers of different materials starting from the silicon substrate. Furthermore, in order to define a particular geometry, these materials may be annealed, polished, etched partially (using photolithography) or fully as is the case for sacrificial layers.

A MEMS component generally comprises, as fixed structure, a cavity forming the volume referred to previously, and comprises discontinuous electrodes creating a topology at the surface of the substrate.

The production of a MEMS must take into account the requirements of a design brief. These requirements include for example, in the case of a membrane type element: the actuating voltage and/or the amplitude of movement of the membrane, the resonant frequency, the mechanical properties of the membrane, etc.

Based on this design brief, a dimensional computation of the membrane and of the fixed structure is carried out according to the constituent material chosen. Appropriate computational software applications are used to obtain, through simulation, functional distances (or "gaps"—distances separating two parts of the MEMS and which influence the operation of the MEMS depending on whether they are too great or too small), such as the length and the width of the membrane, the depth of the cavity, or the air gap separating two electrodes of a switch. A high number of these functional distances is directly defined by the vertical dimensions of the elements composing the cavity of the MEMS, the vertical axis referring in particular to an axis perpendicular to the plane of the membrane.

As referred to in U.S. Pat. No. 5,919,548 or EP 1 900 679, the fabrication of a MEMS with a suspended element conventionally comprises the partial etching of a silicon substrate to form a cavity defining the volume destined to receive the movable element in its movements, the thermal oxidation of the substrate so etched to provide an electrically insulating layer, the formation of a first MEMS level (for example contacts and electrical traces constituting the fixed part of the MEMS) in the cavity on the electrically insulating layer, the deposition of a sacrificial layer to cover that first level, then the formation of a second MEMS level (the movable element with contacts and/or electrical traces) on the sacrificial layer before elimination of that layer to free the movable element.

In the aforementioned article titled "DIELECTRIC CHARGING SENSITIVITY ON MEMS SWITCHES", the method for fabricating an ohmic electrostatic switch first of all provides for thermal oxidation of the silicon substrate to form a thick silicon oxide layer (generally silicon dioxide $SiO_2$ or "silica" over a few micrometers, for example between 5 and 10 μm) on that substrate.

The current techniques for thermal oxidation are sufficiently well mastered to obtain $SiO_2$ layers of even thickness over the whole of the substrate or locally, and to be able to precisely choose that thickness, ranging from a few atomic layers to several tens of μm (micrometers).

Next two etching steps performed successively on that $SiO_2$ layer are then necessary to obtain two vertical functional distances respectively creating the cavity defining the volume and the projections destined to support an electrical contact, an electrical trace or an electrode for example.

The etchings are only partial here so as to keep a certain thickness of $SiO_2$ at every point of the structure, in order to ensure electrical insulation of the substrate. Furthermore, by only partially etching that structure, etchants that are non-selective relative to the Si substrate (and which are thus more numerous) may be used.

The following part of the fabrication to successively create the first MEMS level, the sacrificial layer, the second MEMS level with an electrical contact facing that carried by a said projection, and to eliminate the sacrificial layer, remains conventional.

As mentioned previously, controlling the functional distances plays a key role in the proper operation of the MEMS.

By way of illustration, the depth of the cavity must be sufficient to accept the amplitude of movement of the movable element of the MEMS. In the same way, the air gap which, in an ohmic electrostatic switch, separates the electrode disposed on the fixed structure of the MEMS and the electrode disposed facing it on the suspended element directly affects the actuating voltage that enables the switch to be switched. In this last example, the precise knowledge of the air gap enables the actuating voltage to be adjusted.

In the various known techniques for fabricating a fixed semiconductor structure defining a volume as described above, all the functional distances are defined by the dimensions etched in the substrate or the $SiO_2$ layer. This is in particular true for the depth of the volume provided to receive the movement of the movable element, and for the air gap between electrical contacts or electrodes of the switch.

Although techniques exist, for example masking, which enable precise control of the etching in two dimensions (in fact, along the plane of the substrate), the control of the depth of etching proves to be excessively difficult and thus potentially detrimental for the production of MEMS.

To be precise, the depth of etching depends not only on the time of exposure to the etchant, but also on other parameters making it difficult to determine the exact end point for etching. Excessive or insufficient etches liable to be detrimental to the operation of the MEMS component may then occur.

Moreover, this difficulty in controlling the depth of etching restricts the reproducibility of these fabricating methods. This limits the production of high numbers of similar MEMS.

Lastly, the etching mechanisms prove to lack homogeneity in different places on the same silicon wafer. Observations show that variations in etching depths of an order greater than 10% may occur on the same machined wafer. The same wafer used for the fabrication of a high number of identical MEMS may thus produce MEMS of very variable quality, certain MEMS (generally on the edges of the wafer) possibly proving not to be usable. Furthermore, a margin of error must be applied to the oxide thicknesses to take into account this variation.

In the case of the article titled "DIELECTRIC CHARGING SENSITIVITY ON MEMS SWITCHES", these defects of accuracy, of reproducibility and of homogeneity are furthermore magnified due to the implementation of several successive etchings on the same $SiO_2$ layer.

These various manufacturing techniques thus produce a non-negligible quantity of MEMS that are defective or which require error margins to be taken into account. These error margins may in particular influence the mode of operation of the MEMS component (for example by having to increase actuating voltages, which leads to excessive electricity consumption).

The present invention aims to mitigate at least one of the above-mentioned drawbacks.

From PCT Publication No. WO 2004/016036 is also known the fabrication of transducers having a single cavity, by using thermal oxidation of a substrate followed by an etching of the oxide layer, and lastly a new oxidation to form an electrically insulating layer.

From U.S. Pat. Publication No. 2006/003511 is also known the fabrication of a semiconductor device with several gates, during which a first gate is protected by deposition of an oxide layer, and the other two gates are formed by thermal oxidation, followed by etching and a new thermal oxidation.

It is desired to be able to control the height of several elements relative to each other when fabricating a structure constituted by these various elements and intended to be closed.

SUMMARY

With that aim, the invention concerns in particular a method for fabricating a fixed structure (in particular of semiconductor) having at least two elements respectively having at least one distinct vertical dimension in a volume defined by said fixed structure, wherein it comprises:
a prior step of determining at least three thicknesses depending on the at least two vertical dimensions associated with said at least two elements;
at least two successive steps of forming, on a substrate of which at least one surface is of thermally oxidizable material, the at least two elements, each forming step comprising:
  a step of thermal oxidation of the substrate to form, on a bare portion thereof, an oxide layer to a thickness equal to one of the thicknesses, and
  a step of etching, which is selective relative to said thermally oxidizable material, of the oxide layer so formed to define said volume in an etched portion of said layer by baring the underlying substrate and to define at least one of the elements in at least one unetched portion of said layer,
and a later step of thermal oxidation of the substrate to form, on a bare portion thereof, an oxide layer to a thickness equal to the third thickness, so as to obtain the at least two elements having the at least two vertical dimensions and which are formed solely by the successive oxidations of the substrate.

For the implementation of the invention, the substrate may equally well be a homogenous substrate of a thermally oxidizable material, or a heterogeneous substrate of which at least one of the surfaces (generally the upper part) is of thermally oxidizable material, such as silicon or germanium.

The invention thus makes it possible to obtain a cavity of oxide, the substrate of which is electrically insulated, able to enter into the design of MEMS.

According to the invention, the height of the elements constituting the fixed structure is defined using successive thermal oxidations. This results in the implementation of etching that is selective relative to the material of the substrate which eliminates the entire thickness of oxide at the location of said etched portion.

A knowledge of the oxidation mechanisms then makes it possible to know precisely the height resulting from the oxidation differential between the unetched portion undergoing a new oxidation and the etched portion on which the substrate that has been bared is oxidized again.

Because, compared to the conventional etching operations, thermal oxidations give better control in the formation of the oxide layers (precise thickness and uniform layer with in particular irregularities appreciably less than 10%, or even less than 3%), more accurate functional distances (linked to the vertical dimensions) may be obtained.

The knowledge of the oxidation mechanisms thus makes it possible to determine in advance the thicknesses to form at the time of each thermal oxidation (these oxidations being cumulative at the location of the unetched regions to form the elements of the fixed structure) to obtain the desired vertical dimensions in the end.

Thus the present invention gives increased control over the vertical dimensions (relative to the plane defined by the substrate) that are produced on fabricating a fixed structure. This increased control is in particular obtained by the fact that the topology of the structure is henceforth defined solely by thermal oxidations, which prove to be more precise, reproducible and homogeneous than the etching operations conventionally used to define the gaps.

In particular, relative to the techniques of the state of the art, the production of the elements solely by successive steps of thermal oxidation enables their relative height (or relative altitude) to each other within the cavity to be controlled.

It will be noted that in addition to the advantages resulting from a mastery of the functional distances, the invention also enables the error margins to apply at the time of the fabrication to be reduced.

It will furthermore be noted that a second forming step directly interacts with a preceding step, since the oxide thickness defining the elements formed in the first step is increased by the thermal oxidation of the second forming step.

Thus, the elements of the fixed structure are progressively (or iteratively) formed by the addition of several oxide layers. This progressive formation by addition of thicknesses proves to be appreciably better controlled, easily reproducible and more homogenous than successively performing etching on the same oxide layer.

The implementation of successive steps of forming by thermal oxidation thus makes it possible to precisely control two vertical dimensions in the fixed structure, and thus two vertical functional dimensions in a resulting MEMS, for example the depth of the volume and the air gap between the electrical contacts of the switch: each forming step thus gives the bases for a new functional distance.

Of course, the invention is not limited to two forming steps. The number of forming steps may be equal to the number of different vertical dimensions associated with the elements to form, in order for example to give a greater number of functions in the resulting MEMS. In particular the method may comprise three steps of forming elements as described below.

In an embodiment, a portion that is unetched in a first forming step is a portion that is unetched in a later forming step. This provision is in particular applicable to all the portions that are unetched in the first forming step.

This provision enables the thickness of the oxide layer to be increased at the location of the portion that is unetched in the first forming step, to progressively form the elements of the fixed structure, by controlling the increment of the thickness, the homogeneity and the reproducibility.

In an embodiment, in a first forming step, said at least one unetched portion forms walls defining said volume. By defining said volume of the cavity of a MEMS for example, the walls define the frame of reference in ascertaining the functional distances. More particularly, the suspended elements of the MEMS (deformable membranes for example from which the functional distances have the greatest importance) are generally fastened to the top of these walls as will be illustrated below.

According to a particular feature, said first forming step forms an oxide layer to first thickness E1 and the later forming step or steps each form an oxide layer which, over a bared portion of the substrate, has other thicknesses Ei, where i identifies a later forming step, such that the walls defining said volume have, after the later forming steps, an oxide thickness strictly comprised between E1 and E1+ΣEi.

According to another particular feature, at a later forming step, an unetched portion at the location of a portion fully etched at the immediately preceding etching step forms at least one abutment. This abutment may constitute an abutment for a MEMS mechanically movable element, for example an anti-sticking abutment for a deformable membrane.

According to still another particular feature, at a later forming step, an unetched portion at the location of a portion fully etched at the immediately preceding etching step forms at least one projection to receive an electrical contact. This projection, provided ultimately with an electrical contact (including an electrical trace or an electrode) is for example intended to interact with an electrical contact supported by a MEMS movable element situated facing that projection.

It is possible for example to successively create the walls, abutments and a projection in that order, which is particularly adapted to the fabrication of a fixed structure of a MEMS switch.

According to a feature of the invention, the method comprises a step of cleaning the bared portion of substrate, before later thermal oxidation, in particular the thermal oxidation in a later forming step. The cleaning may be carried out using chemical solutions in a wet environment or by annealing (for example in a vacuum).

This provision makes it possible to obtain, in particular in the case of a substrate of silicon, a dielectric as well as a Si/SiO$_2$ of very good quality, contributing to effective operation of certain MEMS. This is in particular the case of RF switches in which the poor quality of the Si/SiO$_2$ interfaces is liable to greatly increase the RF signal losses.

According to a particular feature of the invention, said selective etching implements wet etching. Better selectivity is thus obtained in relation to the material constituting the substrate (for example silicon or germanium), which makes the forming steps easier to manage since that better selectivity then requires less control for the etching phases.

To be precise, the selectivity of certain etchants (such as hydrofluoric acid HF in relation to silicon) may prove to be particularly high using the wet route.

It is to be noted however that reduced control of the etching duration must be made in order to limit the lateral attack on the oxide layer due to the isotropic character of wet etching.

In an embodiment, the steps of thermal oxidation of the substrate are carried out at a temperature between 800° C. and 1100° C. The use of high temperatures is particularly well-adapted to the fast production of oxide layers of large thickness of over a micrometer, in particular in the case of a silicon substrate.

In an embodiment, the fixed structure is a micro electro-mechanical system fixed structure which defines a volume adapted to receive a mechanically movable element of the micro electro-mechanical system. More particularly, the creation of volumes in structures of semiconductors finds a very advantageous application in protecting or receiving the MEMS movable parts.

In an embodiment, said substrate is initially planar before the first forming step. This provision enables better control of the parameters relating to the thicknesses of the oxide layers obtained in the thermal oxidations. More particularly, in the presence of irregularities, the thermal oxidation of the surface of the substrate could present more pronounced inhomogeneities and thus present less precise oxide thicknesses.

According to a feature of the invention, said prior determining step comprises evaluating said thicknesses by computer simulation. Given current computing performance, computer simulation enables precise thicknesses to be obtained and thus precise vertical dimensions (and the associated functional distances).

By way of example, the ATHENA software application of the company SILVACO (trade names) which is well known to the person skilled in the art enables methods of thermal oxidation of silicon to be simulated and may thus be used in the context of the present invention.

The invention also concerns a method of fabricating a micro electro-mechanical system (MEMS) comprising the following steps:
    fabricating a micro electro-mechanical system fixed structure as described above,
    forming a mechanically movable element suspended from said fixed structure and configured to move in the volume defined by said fixed structure so fabricated.

As will be seen below, the step of forming a mechanically movable element may comprise the following steps:
    forming a sacrificial layer in said volume defined by said fixed structure so fabricated,
    forming, on said sacrificial layer, a layer adapted to constitute a mechanically deformable membrane, and
    eliminating said sacrificial layer so as to free said membrane.

A step of planarization of the sacrificial layer before forming the membrane may possibly be carried out. The creation of a circuit topology (contact, electrical traces and electrodes for example) is also provided.

In an embodiment, the method comprises, prior to the step of fabricating the mechanically movable element, a step of depositing a protective layer on said fixed structure.

This provision makes it possible in particular to counter possible attacks on the fixed structure (of the SiO$_2$ layer forming the walls and the projections or abutments) by etching, for example, when forming the mechanically movable element. This is in particular the case when a sacrificial layer of deposited silicon oxide is used since the etchant used for its elimination would also tend to attack the fixed structure (in particular the insulating layer), in the absence of that protective layer.

In particular, said protective layer comprises a species chosen from $Si_3N_4$, Si, Al and W. This provision is particularly well adapted to prevent an attack by an etchant dedicated to the etching of a silicon oxide.

According to one aspect of the invention, said micro electro-mechanical system is a switch, in particular an ohmic electrostatic switch.

BRIEF DESCRIPTION OF THE DRAWING

Still other particularities and advantages of the invention will appear in the following description, illustrated by the accompanying drawings, in which.

DETAILED DESCRIPTION

Figure 1:
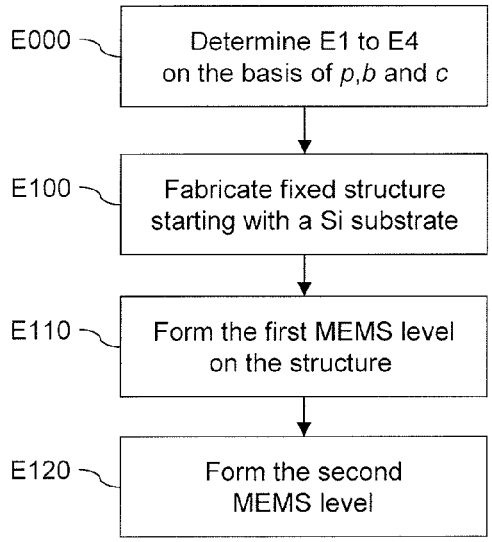
FIG. 1 illustrates, in flow diagram form, general steps of a method for fabricating a MEMS implementing the present invention.

FIG. 1 diagrammatically illustrates general steps for the fabrication of a MEMS starting with a silicon substrate. For the following part of the description, the fabrication of a switch will be detailed although the invention can apply to other types of MEMS and semiconductor structure. Furthermore, the invention may apply to other natures of substrate, for example a germanium substrate.

Furthermore, although the fabrication of a MEMS 1 is described below, it is conventional, in fact, to perform the fabrication of a high number of MEMS at the same time, all carried on one or more wafers (or slices) of silicon treated at the same time.

Figure 6:
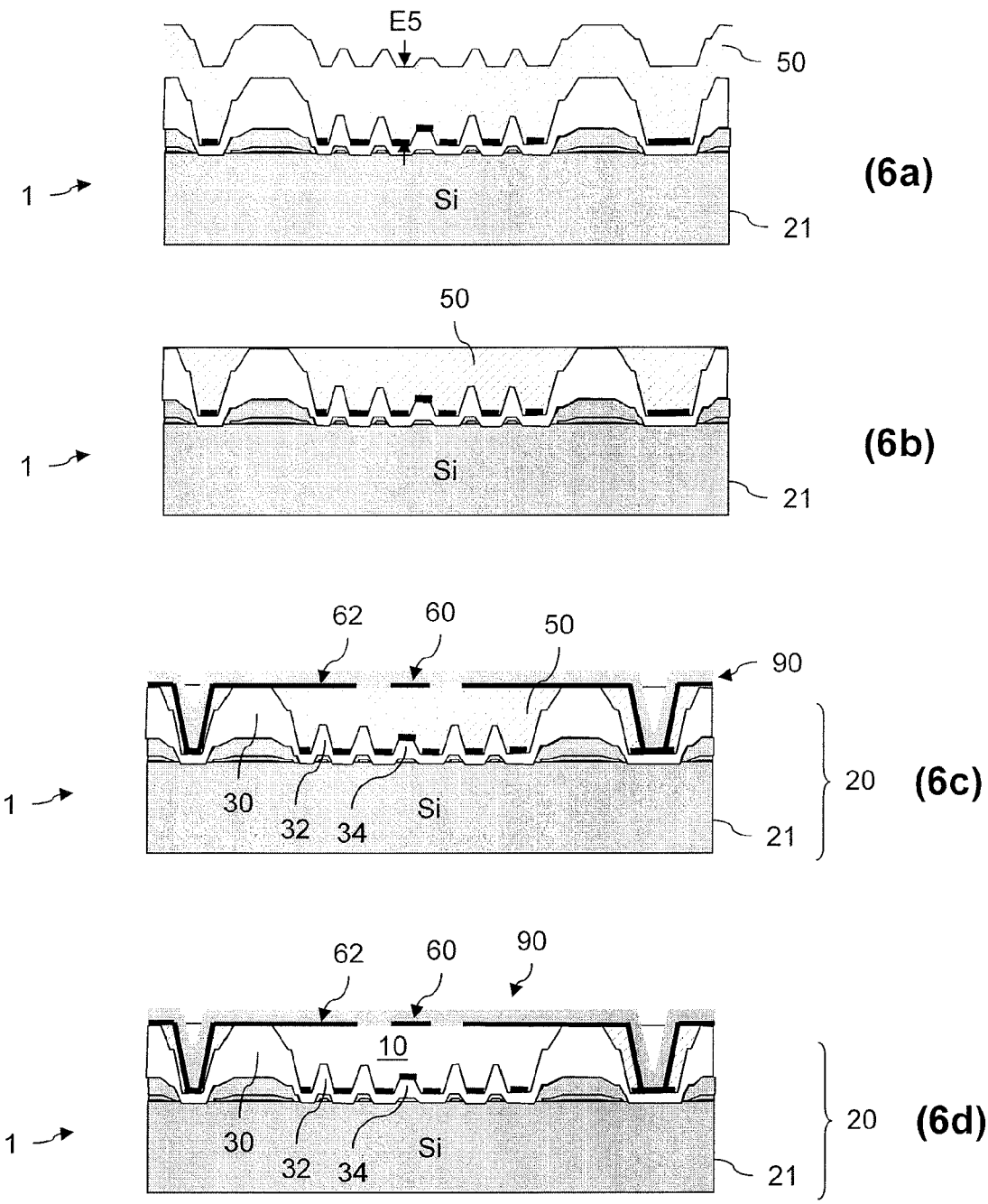
FIG. 6 illustrates, in flow diagram form, the development of the MEMS fixed structure during the steps of FIG. 5.

As represented in FIG. 6d, a MEMS 1 may comprise a cavity 10 formed in a fixed structure 20 (first part of the MEMS) and defining a volume of which the vertical dimensions provide an amplitude for movement for a movable element 90 (here a deformable membrane) constituting the second part of the MEMS 1.

The amplitude of movement of the movable element 90 is in particular defined by functional gaps defined between different elements of the fixed structure. In an example of implementation of the invention, functional gaps such as the contact air gap, the distance from the membrane to anti-sticking abutments or the depth of the cavity directly derive from the vertical dimensions p, b and c (FIG. 3h), respectively of a projection 34 comprising an electrical contact, of an abutment 32 and of the walls 30 of the cavity.

At a first step E000, based on the desired functional gaps and thus on the desired vertical dimensions p, b and c, thicknesses Ei (E1 to E4 in the following example) are determined. As will become apparent below, these thicknesses are used in successive oxidations of a substrate 21 to progressively and iteratively form the different elements constituting the cavity, for example the walls 30, the abutment 32 and the projection 34.

This determination may in particular be performed by computer simulation of thermal oxidations of a substrate 21 to know precisely the influence of the oxidation conditions and the presence of oxide layers on the oxidation of the substrate underlying those layers relative to the oxidation of that same bared substrate.

By way of illustration, starting with the following desired vertical dimensions:
height c of the walls 30=3.2 µm
height b of the abutments 30=2.2 µm
height p of the projection 34=0.9 µm.
a computer simulation enables the following thicknesses to be determined:
E1=1.7 µm,
E2=2 µm,
E3=1.3 µm, and
E4=2 µm.

Knowing these thicknesses Ei, the fixed structure 20 comprising the cavity 10 is fabricated starting with a silicon substrate 21 at a step E100.

According to the invention and as described below, this step E100 comprises at least one step of forming at least one element (for example a wall 30, an abutment 32 or a projection 34) of said fixed structure 20 on a substrate 21 for example of silicon, the forming step comprising a step of thermal oxidation of the substrate to form, on a bared portion thereof, an oxide layer to a thickness equal to a first thickness determined at step E100, and a step of etching, which is selective relative to said thermally oxidizable material, of the oxide layer thus formed to define said volume in an etched portion of said layer by baring the underlying substrate and to define the element in at least one unetched portion of said layer.

Different embodiments of this step E100 are described below with reference to FIG. 2.

To form a MEMS 1, step E100 is followed by a step E110 of forming a first level of electrical topology of the MEMS. This principally involves the creation of electrical contacts, electrical traces or other electrodes 40/42/44 on the fixed structure 20 created at step E100.

Conventional techniques of material deposition, of photolithography and of etching may be implemented to form this first level on each structure formed on the same silicon wafer.

In the method for fabricating a switch detailed below, a thin layer of gold (Au) is deposited by PVD (for "physical vapor deposition") to a thickness of approximately 1 µm then a thin layer of a contact material (for example ruthenium or another element of group 5 of the periodic table of the elements), also by PVD, to 0.1 µm.

The formation of the first level of topology E110 is followed by the formation of the deformable membrane 90 of the MEMS and of a second level of topology supported by that deformable membrane. This step is referenced E120 and detailed below with reference to FIG. 5.

Figure 2:
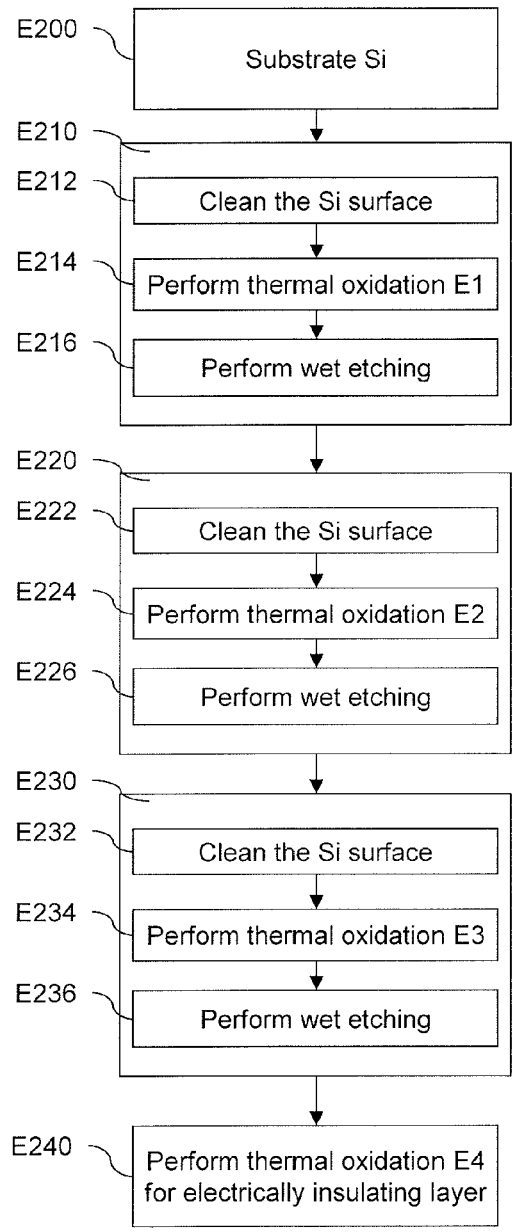
FIG. 2 illustrates, in flow diagram form, the step of fabricating a MEMS fixed structure during the process of FIG. 1.

Referring now to FIG. 2, the step E100 of fabricating the fixed structure 20 of MEMS 1 is described in more detail.

Step E200 begins with a conventional substrate of silicon 21. The upper surface 22 of this may in particular have been prepared: for example planarization using conventional techniques.

Figure 3:
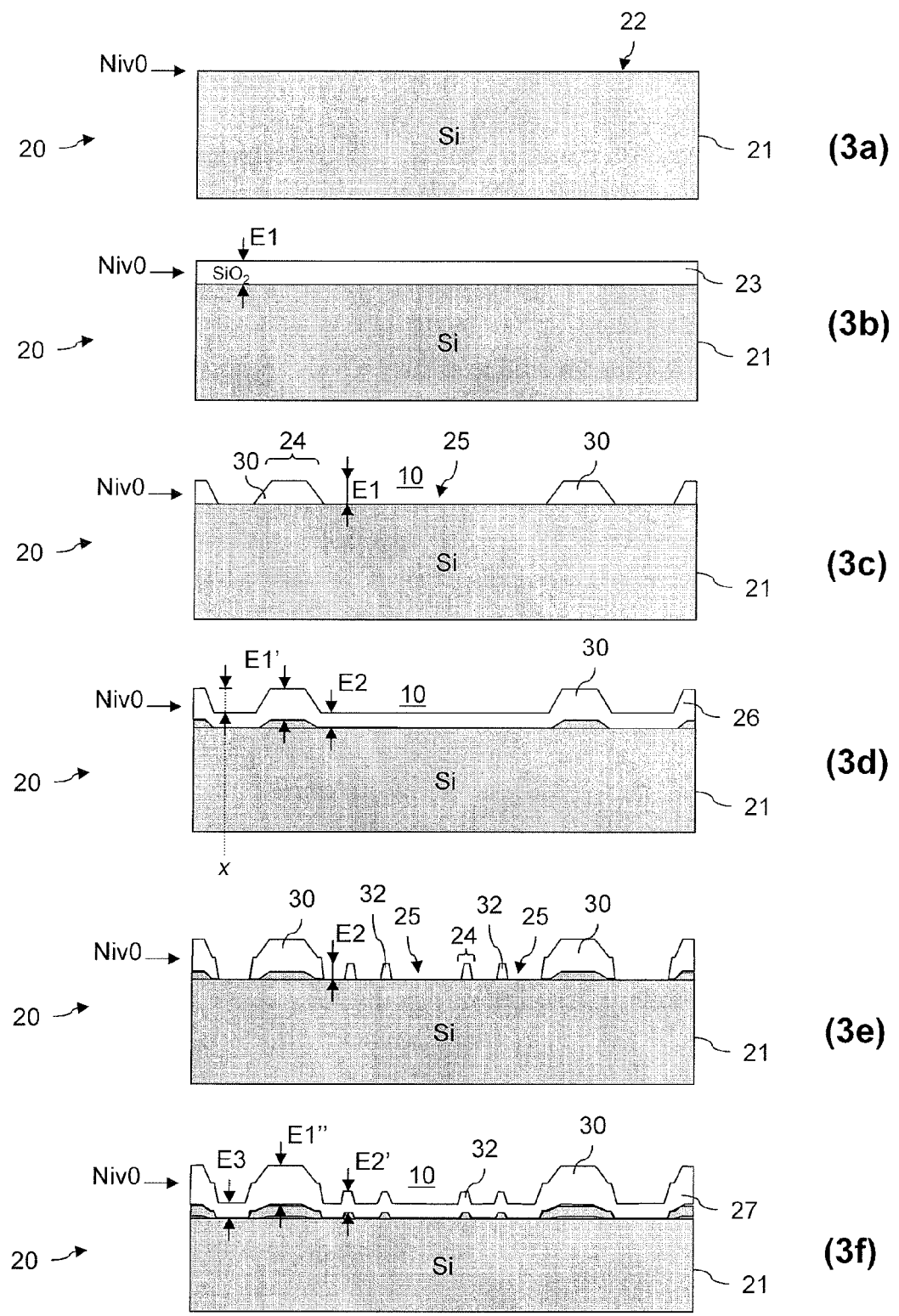
FIG. 3 illustrates, in flow diagram form, the development of a MEMS fixed structure during the steps of FIG. 2.
Figure 3:
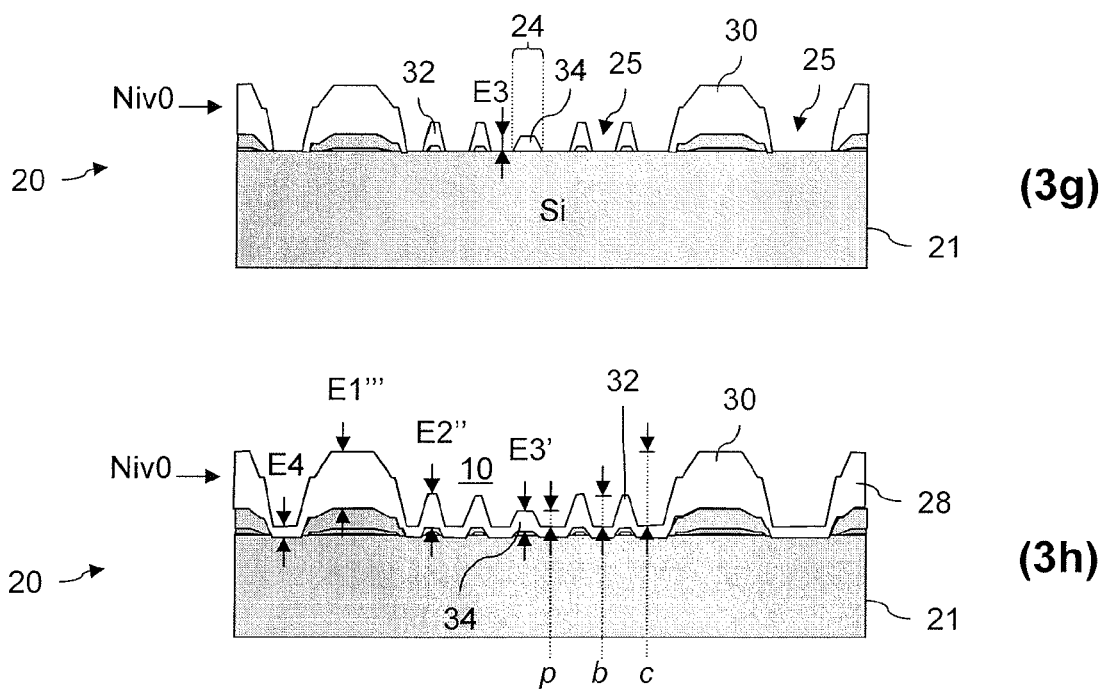

FIG. 3a illustrates, in cross-section, the state of the structure 20 at that time.

The fabrication of the fixed structure 20 continues by performing one or more steps of forming elements, such as walls 30 of the cavity 10, abutments 32 or projections 34 destined for contact pads.

In the example of FIG. 2, three forming steps E210, E220 and E230 have been provided to define three vertical functional distances (linked to p, b and c) in the fixed structure 20 as will become apparent from the following part of the description.

Of course, a higher number of forming steps may be provided for example to increase the number of functional distances according to the design brief for the MEMS to fabricate.

Also, according to various embodiments, a single forming step or two forming steps may be provided: for example, step E210 alone to form a single cavity, steps E210 and E220 to form a cavity provided with abutments or steps E210 and E230 to form a cavity provided with a projection.

In these different approaches, the elements composing the fixed structure are progressively created by consumption of the silicon substrate 21 as will become apparent below. Care will thus be taken, using the forming steps, to define the elements from the one having, in the end, the greatest height down to that with the smallest vertical dimension.

Each forming step follows the same process: a first optional step E212/E222/E232 of cleaning the bared surfaces of the silicon substrate 21; a step E214/E224/E234 of thermal oxidation of the structure 20 thus forming a layer of $SiO_2$ of thickness Ei (i being the iteration number of the forming step) on the bared surfaces of the substrate 21 and thickening that same layer where it is already present by consumption of the substrate; and a step E216/E226/E236 of wet etching of that $SiO_2$ layer to form a part of the cavity 10 and of the elements 30/32/34.

As already indicated earlier, it is this wet etching step E216/E226/E236 which proves to be selective relative to the silicon so as to bare said silicon substrate 21 at the locations of the etched portions.

At the first forming step E210, cleaning is carried out of the upper surface 22 of the substrate 21 to eliminate therefrom the impurities such as organic, carbonate or metal compounds or resin. This enables $Si/SiO_2$ interfaces of much better quality to be obtained after oxidation (which is detailed later).

By way of illustration, this cleaning may consist in placing the silicon wafers in a bath of chemical solution (wet route). As a variant, an operation of annealing those wafers in a vacuum or controlled atmosphere may be performed.

Once the substrate 21 has been cleaned, an operation of thermal oxidation E214 is applied to it so as to obtain a thin layer 23 of thermal oxide, in particular of $SiO_2$ (FIG. 3b). In FIGS. 3b to 3h, only one oxidation face is represented, whereas the rest of the fixed structure 20 may also to be oxidized if it is not protected.

In particular, this thermal oxidation is carried out at high temperature comprised between 800° C. and 1100° C. in order to obtain the thickness E1 determined at step E000 (generally between 1 and 4 μm) in a time that is satisfactory to meet industrial production constraints. The conventional techniques of thermal oxidation enable a thickness E1 of the thermal oxide layer 23 to be obtained which is relatively constant and homogenous over a bare part 22 of the substrate 21.

The thermal oxidation step E214 is followed by a step of etching the layer of $SiO_2$ so obtained in order to form elements of the fixed structure 20, here to form the walls 30 of the cavity 10 (FIG. 3c diagrammatically showing the structure 20—the proportions not having been respected for the needs of illustration).

For the implementation of the invention, this etching is conducted to eliminate the entirety of the thickness E1 in the regions 24 to etch. For this, etchants that are highly selective relative to silicon are used, for example hydrofluoric acid HF or HF based mixtures.

Furthermore, the etching is preferably wet etching, since better selectivities relative to silicon may be obtained. In a variant, dry etching may be performed with the same effects.

This selective etching enables the silicon substrate 21 to be bared at the location of the unetched portions 25, without however attacking the substrate. Only part of the substrate was consumed during the thermal oxidation E214. Preferably etchants that are totally or practically totally selective in relation to silicon are used, so as not to attack it.

Thus, at this stage, walls 30 are obtained the height of which is fully controlled, here equal to E1.

Further to step E210, step E220 enables abutments 32 to be formed in the fixed structure 21.

In the context of a switch type MEMS illustrated here, the main function of these abutments is to prevent the sticking of the membrane 90 on the bottom of the cavity, by ensuring the presence of air under the membrane.

In a manner similar to step E210, it comprises a step E222 of cleaning the bared surfaces 25 of the substrate 20, to provide better thermal oxidation, then a step of thermal oxidation E224 of the structure 20 (substantially the same as that of FIG. 3c), and lastly an etching step E226.

The thermal oxidation E224 is implemented in a similar way to step E214 to obtain a layer 26 of $SiO_2$ of thickness E2 at the location of the bared surfaces 25 of the substrate. By controlling the thermal oxidation, a thickness substantially equal to the thickness E2 determined at step E000 is obtained. Generally, E2 will be comprised between 1 and 4 μm.

As may be noted from FIG. 3d representing the structure after this step, the thickness E1' of thermal oxide at the location of the walls 30 has also increased, but by an additional thickness less than E2: E1<E1'<E1+E2. To be precise, the presence of the elements 30 has slowed the thermal oxidation at these locations (propagation time for the oxygen in the layer 23 which remained on the unetched regions).

As the thermal oxidation consumes the silicon of the substrate 21, this slowing of the thermal oxidation implies reduced consumption of the silicon at the location of the walls 30, as shown diagrammatically in FIG. 3d.

Lastly it is to be recalled that this consumption tends to "drop" the level of the $Si/SiO_2$ and that the oxidation creates a greater volume of thermal oxide relative to the silicon consumed such that the oxide tends to "rise" relative to the initial level (represented by the arrow Niv0 in the drawings—for a thickness e of silicon consumed, the $Si/SiO_2$ interface "drops" by e, whereas the upper surface of the layer created "rises" by a little more than e).

Experiments and/or simulations make it possible in particular to know, on the basis of the width of the elements 30 and the thermal oxidation parameters (time, temperature), the additional thickness (E1'-E1) obtained as well as the "reduced consumption" under the walls 30. This enables E1 and E2 to be determined precisely during step E000, to obtain a precise thickness E1' or height x.

The structure 20 of FIG. 3d is then etched (E226) in similar manner to step E216 by maintaining unetched the unetched portions (here the walls 30) from preceding step E210.

This etching, still strongly selective relative to the silicon, enables the substrate 21 to be bared at the location of the unetched regions 25, and to form new elements of the structure 20, here abutments 32 to a thickness E2 (FIG. 3*e*).

The forming step E230 is similar to step E220 with an optional cleaning step E232, thermal oxidation E234 and etching E236.

At this step E230, the etching E236 enables new elements to be formed in the fixed structure 20, here represented by a projection 34 destined to receive an electrical contact during the formation E110 of the first MEMS level.

FIG. 3*f* illustrates the structure 20 obtained after the thermal oxidation E234 forming a layer 27 of thermal oxide having the determined thickness E3 (generally comprised between 1 and 4 µm) at the location of the unetched regions 25 and increased thicknesses at the location of the walls 30 and abutments 32, with:

E1<E1"<E1+E2+E3; and

E2<E2'<E2+E3.

As mentioned previously, the simulation techniques enable E1, E2 and E3 to be determined precisely during step E000, according to the desired dimensions (E1", E2' and/or the heights of the walls/abutments in the cavity 10).

FIG. 3*g* illustrates the structure 20 obtained after the selective etching E236. A projection 34 of thickness E3 has thus been formed.

These three forming steps E210-E220-E230 enable different elements of the fixed structure 20 to be formed little by little, each defining a vertical functional distance.

As at each step, the entirety of the thickness of $SiO_2$ is etched at the location of the etched regions 25, these functional distances are defined here by the thermal oxidation steps and not by the etching steps. This results in a more precise control of these functional distances, in terms of their value, their reproducibility over time and their homogeneity on the same machined wafer or from wafer to wafer.

Further to the forming steps E210-E220-E230 (it being possible for the number to vary according to the embodiments of the invention), step E240 consists in forming an electrical insulating layer of the substrate 21. This is directed in particular to the etched regions 25, since the elements 30, 32, 34 of thermal oxide already give electrical insulation for the unetched regions.

This step E240 may in particular be carried out by a new thermal oxidation (similar to the oxidations described above) of the structure 20, enabling a layer 28 of thermal oxide $SiO_2$ to be formed (FIG. 3*h*) having the determined thickness E4 (generally comprised between 1 and 4 µm) at the location of the regions 25. Optionally, prior cleaning of the bare regions of the substrate 21 may also be performed just before step E240.

A MEMS cavity of oxide is thus obtained, having good electrical insulation.

Thus, the walls 30 have a thickness E1''' comprised between E1 and E1+E2+E3+E4; the abutments 32 have a thickness E2'' comprised between E2 and E2+E3+E4; the projection 34 has a thickness E3' comprised between E3 and E3+E4.

Once again, E1, E2, E3 and E4 have been precisely determined during step E100, on the basis of desired values c, b, p and E4 (or E1''', E2'', E3' and E4).

By way of illustration, in the conditions of the example referred to earlier, a vertical dimension E1''' in particular is obtained having a value of 3.7 µm.

As these explanations show, by enabling the functional distances (gaps) to be defined through additive steps (thermal oxidation) that are more precise than the steps of elimination (etching), the invention gives more precise control of a set of thicknesses, equally in terms of their values, in terms of their homogeneity within the same wafer and in terms of their reproducibility.

Figure 4:
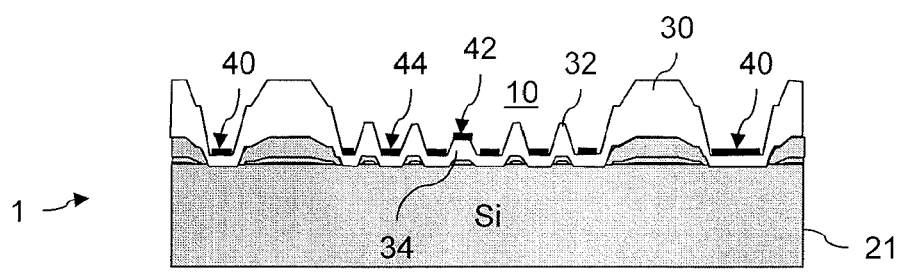
FIG. 4 is a diagrammatic illustration of the state of a MEMS structure at the step of forming a first level of electrical topology of FIG. 1.

FIG. 4 illustrates the step E110 of forming the first MEMS level 1. In this step electrical traces 40, lower electrical contacts 42 (in particular onto the projection 34) and/or electrodes 44 are formed on the lower surface of the cavity 90.

However, optionally, a step may be provided of depositing a protective layer on the silicon oxide layer 28 obtained on finishing step E100.

This protective layer is intended to protect the silicon oxide layer 28 (and thus the bay of cavity 90 and the elements 30, 32, 34 of $SiO_2$) from possible later etchings, in particular from the etching E350 used below to eliminate the sacrificial layer.

Consequently, the nature of this protective layer and the actual presence of this optional step depend on the etchants used in those later etchings, and thus possibly on the nature of the sacrificial layer used below.

For example, if the sacrificial layer used is of silicon oxide, a protective layer could be used made from a material chosen from silicon nitride $Si_3N_4$, silicon Si, aluminum Al and tungsten W.

Figure 5:
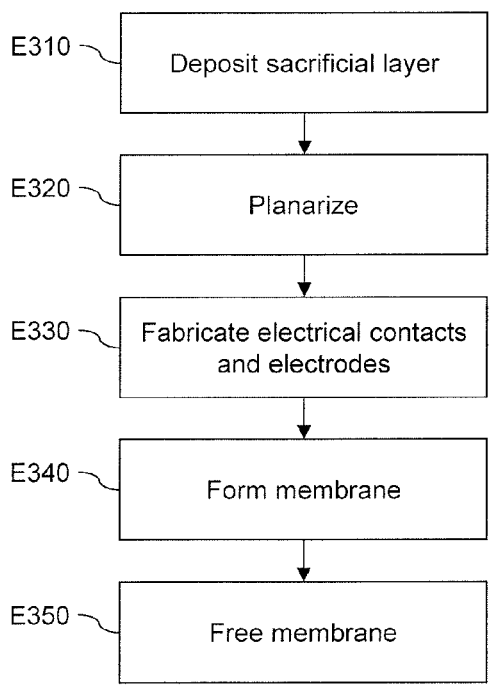
FIG. 5 illustrates, in flow diagram form, the step of forming a second level of electrical topology in fabricating a MEMS in accordance with FIG. 1.

FIG. 5 illustrates the step E120 directed to forming the deformable membrane 90 and the second electrical topology level carried by that membrane. Step E120 starts with the MEMS 1 in the state of FIG. 4.

A first step E310 consists of depositing a sacrificial layer 50, for example of silicon Si by plasma-enhanced chemical vapor deposition (or PECVD) to a thickness greater than or equal to the height c of the cavity, for example to E5=3.4 µm for c=3.2 µm (see FIG. 6*a*).

Other materials may however be used to form all or part of the sacrificial layer, for example a silicon oxide (such as $SiO_2$), a resin, molybdenum, tungsten, etc.

At step E320, the upper surface of the sacrificial layer 50 is planarized, for example by using a chemical-mechanical planarization (or CMP) method (FIG. 6*b*). By virtue of the precise control of this method, the upper surface is made the same height as the height of the walls 30.

This step also contributes to precise control of the functional distances, since the resulting upper surface will delimit the position of the deformable membrane 90 in resting position, as is apparent from what follows.

At step E330, on this sacrificial layer 50, the electrical topology elements constituting the second level of the MEMS 1 are fabricated.

For a switch, it is a matter in particular of depositing an upper electrical contact 60 facing the lower contact 42 carried by the projection 34 and possibly electrical traces. The pair of contacts 60-42 is involved in particular in the excitation and/or in the detection performed during the operation of the MEMS 1. The same techniques as those used at step E110 may be implemented.

Furthermore, vias may be formed, by etching in the sacrificial layer 50, facing the traces 40 or lower contacts 42 to enable electrical connection between the first and second electrical topology levels in the MEMS 1.

Electrodes 62 are also formed on the sacrificial layer 50, by deposition, photolithography and etching for a whole wafer of silicon. These electrodes will be used in combination with the lower electrodes 44 in particular for actuating the switch on application between them of an actuating voltage. For example, a deposition by PVD of titanium nitride TiN to a thickness of approximately 0.1 µm may be implemented.

At step E340, the deformable membrane 90 is formed on each MEMS of a wafer, by deposition, photolithography and etching for a whole wafer of silicon. For example, silicon nitride SiN may be used deposited by PECVD to a thickness of approximately 1 µm.

FIG. 6c represents the MEMS at this stage, the cavity 10 being filled by the sacrificial layer 50.

At the following step E350, the membrane 90 so formed is freed by elimination of the sacrificial layer 50 (FIG. 6d). This elimination may be implemented by conventional techniques of isotropic dry etching of the silicon (when the sacrificial layer is of silicon).

A MEMS 1 is thus obtained the functional distances of which are those indicated previously and defined solely by additive operations (thermal oxidation and possible other dispositions).

For a MEMS of switch type, the invention makes possible a notable improvement in its operation, in particular:
- a reduction in signal losses since the control of the Si/SiO$_2$ interface is of very good quality, in particular due to the recurrent cleaning operations of the bared surfaces of the substrate;
- good control of the actuating voltage due to the precision, the homogeneity and the reproducibility of the functional gap between the electrodes 44 and 62 of the MEMS:
- good control of the contact resistance (or force) between the contacts 60 and 42 supported by the projection 34, also due to the precision, the homogeneity and the reproducibility of the functional gap between the lower 42 and upper 60 contacts of the MEMS.

The preceding examples are only embodiments of the invention which is not limited thereto.

For example, depositions of intermediate layers may be provided between the different forming steps E210-E220-E230, for example by making other materials grow on the walls 30 or the abutments 32. In this case, care will however be taken to use etchants which are also selective with regard to those other materials in order not to attack them, or care will then be taken to protect those intermediate layers.

The invention claimed is:

1. A method for fabricating a fixed structure having at least two elements respectively having at least one distinct vertical dimension in a volume defined by the fixed structure, the method comprising:
   an initial step of determining at least three thicknesses depending on the at least two vertical dimensions associated with the at least two elements;
   at least two successive steps of forming the at least two elements on a substrate of which at least one surface comprises an oxidizable material, each forming step comprising:
   a first forming step comprising thermally oxidizing a bare portion of the substrate to form an oxide layer to a thickness equal to one of the at least three thicknesses, and
   a second forming step comprising selectively etching the oxide layer relative to the thermally oxidizable material to define the volume in an etched portion of the oxide layer by baring the underlying substrate and to define at least one of the at least two elements in at least one unetched portion of the oxide layer; and
   a later step of thermally oxidizing the substrate to form, on a bare portion thereof, an oxide layer to a third thickness of the at least three thickness, so as to obtain the at least two elements having the at least two vertical dimensions and that are formed solely by the successive thermal oxidations of the substrate.

2. A method according to claim 1, wherein a portion that is unetched in a first forming step is a portion that is unetched in a later forming step.

3. A method according to claim 1, wherein, in the first forming step, the at least one unetched portion forms walls defining the volume.

4. A method according to claim 3, wherein the first forming step forms an oxide layer to first thickness E1 and the second forming step or steps each form an oxide layer which, over a bared portion of the substrate, has another first thicknesses Ei, where i identifies a later forming step, such that the walls defining the volume have, after the later forming steps, an oxide thickness strictly comprised between E1 and E1+ΣEi.

5. A method according to claim 1, wherein a number of the forming steps is equal to a number of different vertical dimensions associated with the at least two elements.

6. A method according to claim 1 further comprising a later forming step, wherein an unetched portion at the location of a portion fully etched at the immediately preceding etching step forms at least one abutment.

7. A method according to claim 1 further comprising a later forming step, wherein an unetched portion at the location of a portion fully etched at the immediately preceding etching step forms at least one projection configured to receive an electrical contact.

8. A method according to claim 1, wherein the fixed structure comprises a micro electro-mechanical system fixed structure which defines a volume adapted to receive a mechanically movable element of the micro electro-mechanical system.

9. A method according to claim 1, wherein the initial determining step comprises evaluating the at least three thicknesses by computer simulation.

10. A method of fabricating a micro electro-mechanical system comprising: fabricating a micro electro-mechanical system fixed structure according to claim 1, and forming a mechanically movable element suspended from the fixed structure and configured to move in the volume defined by the fixed structure.

11. A method according to claim 10, wherein the micro electro-mechanical system comprises a switch.

* * * * *